United States Patent
Li et al.

(10) Patent No.: US 12,332,318 B2
(45) Date of Patent: Jun. 17, 2025

(54) SYNCHRONOUS MONITORING CIRCUIT AND SYNCHRONOUS MONITORING METHOD FOR BATTERY MANAGEMENT SYSTEM

(71) Applicant: Silergy Semiconductor Technology (Hangzhou) LTD, Hangzhou (CN)

(72) Inventors: Wei Li, Hangzhou (CN); Lei Hu, Hangzhou (CN); Sihua Wen, Hangzhou (CN)

(73) Assignee: Silergy Semiconductor Technology (Hangzhou) LTD., Hangzhou (CN)

( * ) Notice: Subject to any disclaimer, the term of this patent is extended or adjusted under 35 U.S.C. 154(b) by 75 days.

(21) Appl. No.: 18/136,973

(22) Filed: Apr. 20, 2023

(65) Prior Publication Data

US 2023/0341466 A1  Oct. 26, 2023

(30) Foreign Application Priority Data

Apr. 26, 2022  (CN) .......................... 202210449817.1

(51) Int. Cl.
*G01R 31/3842* (2019.01)

(52) U.S. Cl.
CPC ................................ *G01R 31/3842* (2019.01)

(58) Field of Classification Search
None
See application file for complete search history.

(56) References Cited

U.S. PATENT DOCUMENTS

| | | |
|---|---|---|
| 6,005,780 A | 12/1999 | Hua |
| 6,580,258 B2 | 6/2003 | Wilcox et al. |
| 9,325,254 B2 | 4/2016 | Deng et al. |
| 9,331,588 B2 | 5/2016 | Chen |
| 9,488,680 B2 | 11/2016 | Xu |
| 2013/0325303 A1* | 12/2013 | Kiuchi ............... G01R 31/3648 324/426 |
| 2014/0078789 A1 | 3/2014 | Li et al. |
| 2014/0239934 A1 | 8/2014 | Zhang |
| 2015/0160270 A1 | 6/2015 | Shi et al. |
| 2015/0280578 A1 | 10/2015 | Huang et al. |
| 2019/0285699 A1* | 9/2019 | Weidner ............. H01M 10/425 |
| 2020/0028219 A1* | 1/2020 | Lee ........................ G01R 35/00 |
| 2021/0231713 A1* | 7/2021 | Choi ................... G01R 31/2829 |
| 2024/0288501 A1* | 8/2024 | Crymble ............. G01R 31/382 |

FOREIGN PATENT DOCUMENTS

| | | |
|---|---|---|
| CN | 107064804 A | 8/2017 |
| CN | 108501757 A | 9/2018 |

* cited by examiner

*Primary Examiner* — Jas A Sanghera

(57) ABSTRACT

A method of synchronous monitoring for a battery management system, where the battery management system includes a battery pack having a plurality of batteries coupled in series, can include: obtaining two measurement results representing a state parameter of a battery at a same time; and determining a final result, where a first of the two measurement results is a main measurement result and a second of the two measurement results is an auxiliary measurement result, and the main measurement result is configured as the final result.

20 Claims, 4 Drawing Sheets

SYNCHRONOUS MONITORING CIRCUIT AND SYNCHRONOUS MONITORING METHOD FOR BATTERY MANAGEMENT SYSTEM

RELATED APPLICATIONS

This application claims the benefit of Chinese Patent Application No. 202210449817.1, filed on Apr. 26, 2022, which is incorporated herein by reference in its entirety.

FIELD OF THE INVENTION

The present invention generally relates to the field of power electronics, and more particularly to synchronous monitoring circuits and methods for battery management.

BACKGROUND

Analog front ends (AFEs) are widely used in 12V/48V/400V/1500V battery systems to monitor the battery voltage, the current, and the temperature value of the battery pack in new energy applications, such as electric vehicles and energy storage. Due to the harsh operating environment on site, it is very important for AFEs to provide reliable data for the electronic control unit (ECU) for subsequent processing, such as SOC estimation or fault judgment. In monitoring battery voltage, single-channel ADC sampling may typically be adopted, which can lead to inaccurate sampling accuracy when the system noise is relatively high, and this approach may not meet requirements of ASIL D accuracy.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
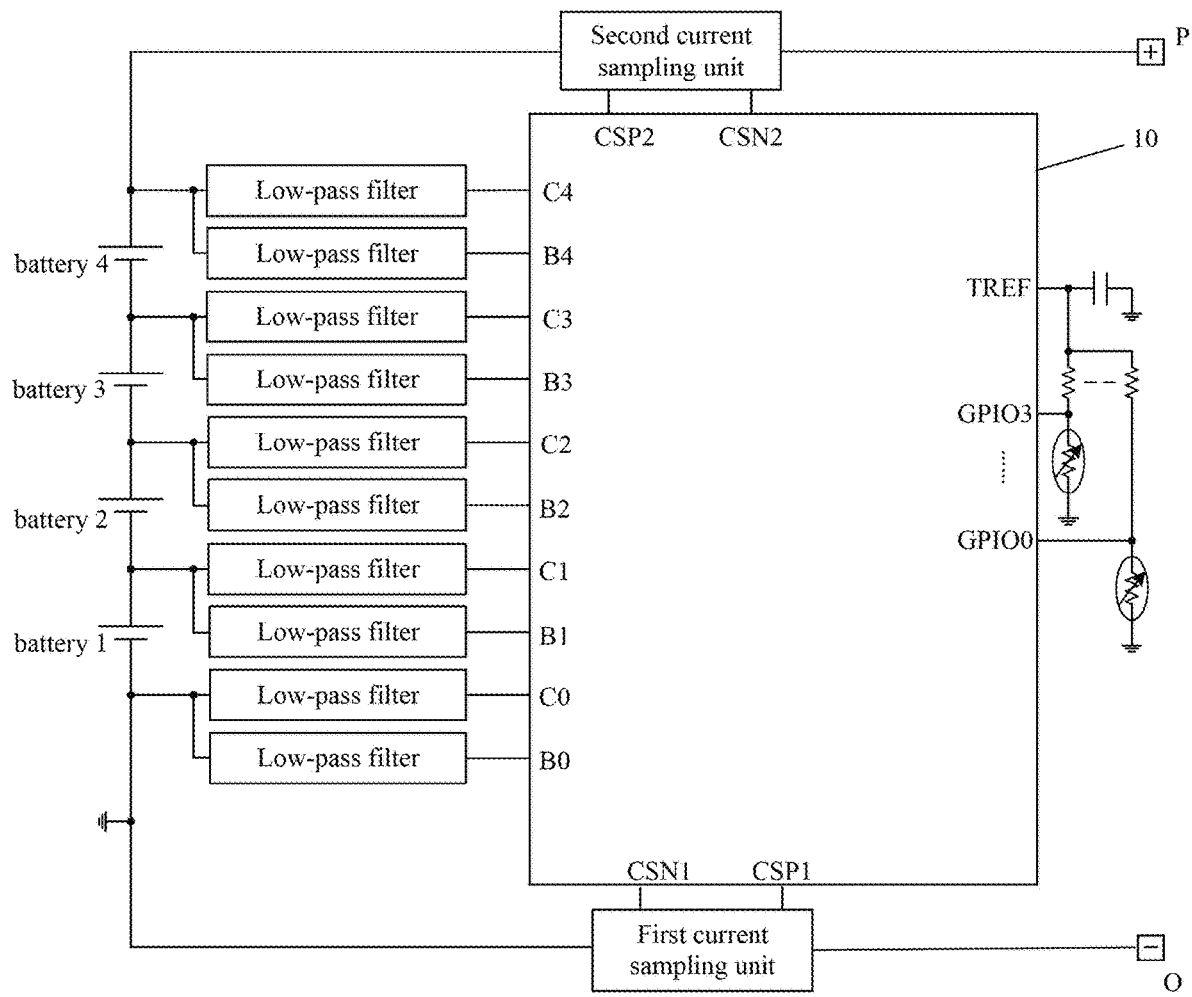
FIG. 1 is a schematic circuit diagram of a first example synchronous monitoring circuit for a battery management system, in accordance with embodiments of the present invention.

Referring now to FIG. 1, shown is a schematic circuit diagram of a first example synchronous monitoring circuit for a battery management system, in accordance with embodiments of the present invention. In this particular example, the battery management system can include N batteries connected in series to form a battery pack. The anode of the battery with the highest potential can connect with terminal P, the cathode of the battery with the lowest potential can connect with terminal O, and terminal O can connect with the reference ground. In this particular example, N=4. The battery management system can also include synchronous monitoring circuit 10, which can measure the related state parameters of the battery (e.g., battery voltage, battery current, battery temperature value where the battery is located, and other state parameters of the battery), determine whether a fault occurs in the measurement process, and accordingly process and control the measurement result. Of course, those skilled in the art will recognize that the battery management system can also include other modules and circuits to realize battery management and control.

In order to meet requirements of ASIL D accuracy, synchronous monitoring circuit 10 can include a data processing module, which can obtain two measurement results representing a state parameter of the battery at the same time, and determine whether a fault occurs in the measurement process according to the difference between the two measurement results. It should be understood that "at the same time" here means the two measurement results obtained at the same moment, which can ensure consistency of the two measurement results and avoid errors caused by measurements at different moments. In addition, by obtaining the difference between the two measurement results, the common-mode signal is eliminated and the measurement error caused by different noise interference on the sampling paths can also be avoided. It should be understood that in some cases, if the two measurement results are slightly different in time due to the influence of the delay controlled by the circuit or other parameters, it may still be considered as the measurement results being obtained at the same moment. When the difference between the two measurement results is greater than a predetermined value, this can indicate that a fault occurs in the measurement process. When the difference between the two measurement results is not greater than the predetermined value, one of the measurement results (e.g., the main measurement result) can be selected as the feedback signal. It should be understood that one of the two measurement results is the main measurement result, which can be used as a feedback signal, and the other of the two measurement results is the auxiliary measurement result, which can be used for comparison with the main measurement result for synchronous diagnosis, whereby the main measurement result is configured as a final result.

Firstly, the sampling of battery voltage is explained below. Synchronous monitoring circuit 10 can include a first voltage sampling port group that can acquire sampling signals representing the voltage of each battery via a first voltage sampling path, and a second voltage sampling port group that can acquire sampling signals representing the voltage of each battery via a second voltage sampling path. The first voltage sampling path and the second voltage sampling path can be independent of each other. For example, the first voltage sampling port group can include N+1 first voltage sampling ports respectively coupled to N+1 battery electrodes, and the second voltage sampling port group can include N+1 second voltage sampling ports respectively coupled to N+1 battery electrodes. It should be understood that N batteries can connect in series to form N+1 battery electrodes, and the battery electrodes may refer to the anodes or cathodes of the batteries. In this example, the first voltage sampling port group can include ports C0-C4, and the second voltage sampling port group can include ports B0-B4. Ports C0 and B0 can be coupled with the cathode of battery 1, ports C1 and B1 can be coupled with the anode of battery 1 (e.g., the cathode of battery 2), ports C2 and B2 can be coupled with the anode of battery 2 (e.g., the cathode of battery 3), ports C3 and B3 can be coupled with the anode of battery 3 (e.g., the cathode of battery 3), and ports C4 and B4 can be coupled with the anode of battery 4.

Figure 2:
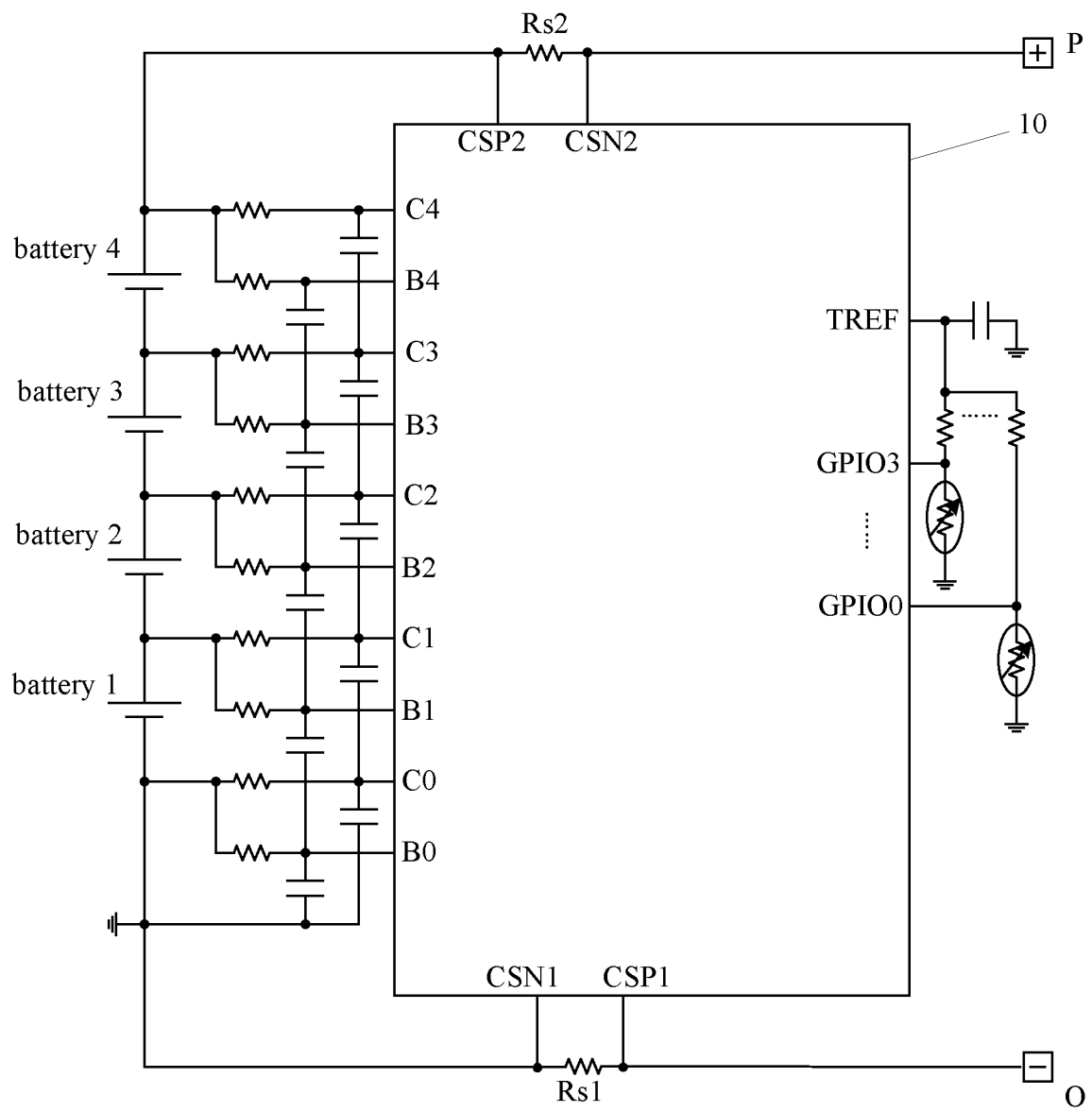
FIG. 2 is a schematic circuit diagram of a second example synchronous monitoring circuit for a battery management system, in accordance with embodiments of the present invention.

Referring now to FIG. 2, shown is a schematic circuit diagram of a second example synchronous monitoring circuit for a battery management system, in accordance with embodiments of the present invention. In order to make the battery voltage sampled by each port more stable, each first voltage sampling port and each second voltage sampling port can respectively be coupled to the corresponding battery electrode via a low-pass filter. It can be understood that the low-pass filter can be formed of any suitable low-pass filter circuit, such as low-pass filter circuit is RC filter circuit as shown in FIG. 2, which includes resistors and capacitors. For the first voltage sampling path, that is, the path to obtain the sampling signals through ports C0-C4, the resistor in the low-pass filter can connect between the current first voltage sampling port and the anode or cathode of the corresponding battery, and the capacitor in the low-pass filter can connect between the current first voltage sampling port and the next first voltage sampling port. For the second voltage sampling path, that is, the path to obtain the sampling signals through ports B0-B4, the resistor in the low-pass filter can connect between the current second voltage sampling port and the anode or cathode of the corresponding battery, and the capacitor in the low-pass filter can connect between the current second voltage sampling port and the next second voltage sampling port.

Secondly, the sampling of battery current is explained below. Synchronous monitoring circuit 10 can include a first current sampling port group that can acquire a sampling signal representing a current flowing through the batteries via a first current sampling path, and a second current sampling port group that can acquire a sampling signal representing the current flowing through the batteries via a second current sampling path. For example, the first current sampling port group can include two first current sampling ports connected with a first current sampling unit. The first current sampling unit can connect between terminal O and the cathode of the battery with the lowest potential, and the second current sampling port group can include two second current sampling ports connected with a second current sampling unit, where the second current sampling unit can connect between the anode of the battery with the highest potential and terminal P.

In particular embodiments, the first current sampling port group can include ports CSP1 and CSN1, which are the output ports of the first current sampling unit, and the potential difference between ports CSP1 and CSN1 can characterize the current flowing through the batteries. The second current sampling port group can include ports CSP2 and CSN2, which are the output ports of the second current sampling unit, and the potential difference between ports CSP2 and CSN2 can also characterize the current flowing through the batteries. It should be understood that in some examples, the first and second current sampling units can use the sampling resistor in order to sample the battery current. For example, as shown in FIG. 2, the first current sampling unit can include sampling resistor Rs1 connected between the cathode of battery 1 and terminal O, and the two ends of sampling resistor Rs1 can connect with ports CSP1 and CSN1 respectively. Similarly, the second current sampling unit can include second sampling resistor Rs2 connected between the anode of battery 4 and terminal P, and two ends of second sampling resistor Rs2 can connect with ports CSN2 and CSP2 respectively.

Synchronous monitoring circuit 10 can also include a plurality of temperature sampling ports, which may respectively acquire temperature sampling signals representing the temperature values where the different batteries are located through the temperature sampling unit. In this example, synchronous monitoring circuit 10 can include four temperature sampling ports GPIO0-GPIO3 for measuring the temperature values where the different batteries are located. It should be understood that the number of temperature sampling ports can be set according to particular needs. In order to realize temperature sampling, synchronous monitoring circuit 10 can also include port TREF to provide a reference temperature. A common resistor with a fixed resistance can connect in series between port TREF and each temperature sampling port, and a thermistor can connect between each temperature sampling port and the reference ground, thus forming a plurality of temperature sampling units. When the temperature value measured at the corresponding temperature sampling port changes, the resistance of thermistor connected to the corresponding port temperature can sample changes, resulting in a change of the shared voltage of the thermistor, thus changing the temperature sampling signal obtained at the corresponding temperature sampling port.

After obtaining the sampling signals of the state parameters of the battery, the synchronous monitoring circuit can also determine whether these sampling signals are correct, so the data processing module in the synchronous monitoring circuit may receive the sampling signals of each port respectively to diagnose the state parameters such as voltage, current, and temperature, in order to realize different control logics. In this example, the data processing module can include a voltage processing module and a current processing module. The voltage processing module can acquire voltage sampling signals, temperature sampling signals, and other electrical signals of each battery, and may perform corresponding control on the voltage sampling signals, temperature sampling signals, and other electrical signals of each battery. The current processing module can obtain the sampling signal representing the current flowing through each battery and accordingly control the sampling signal. In some cases, synchronous monitoring circuit 10 may only include a voltage processing module or a current processing module.

Figure 3:
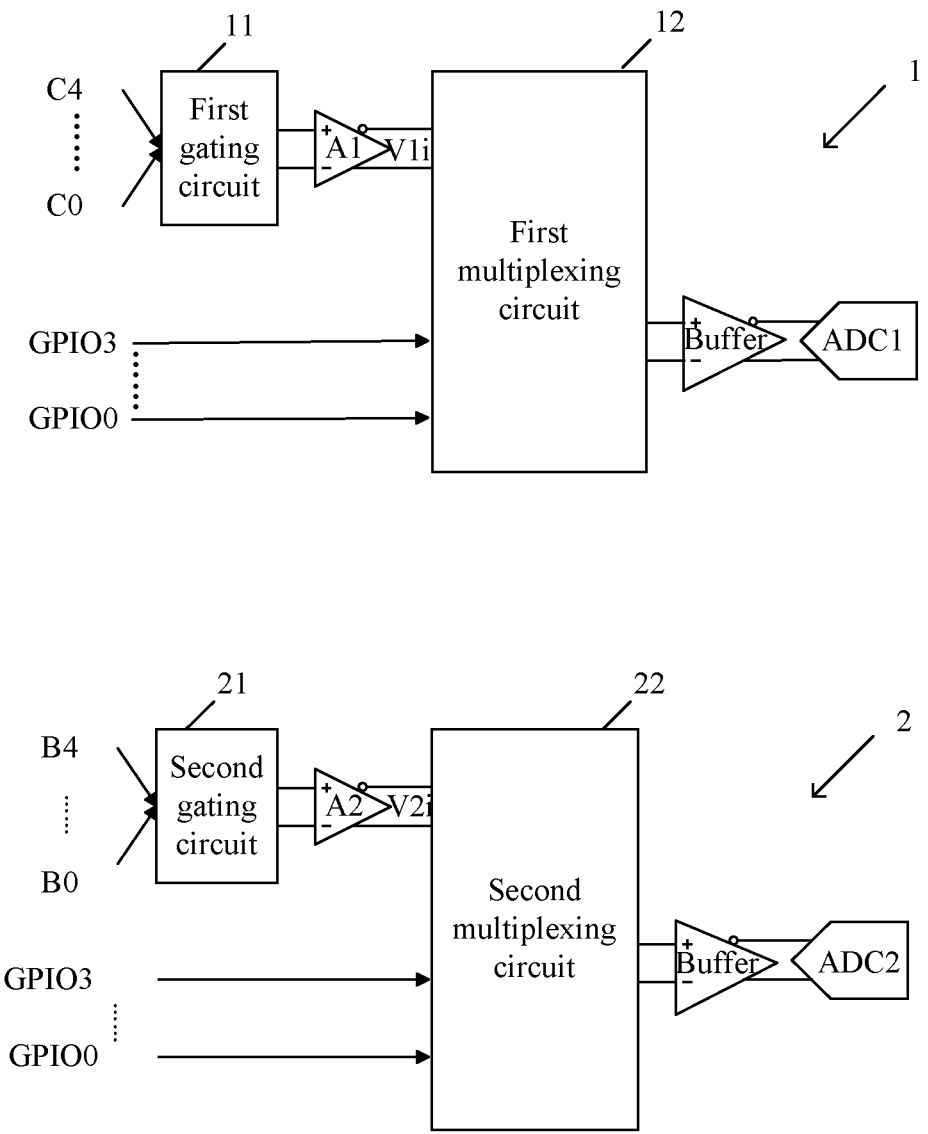
FIG. 3 is a schematic circuit diagram of an example voltage processing module, in accordance with embodiments of the present invention.

Referring now to FIG. 3, shown is a schematic circuit diagram of an example voltage processing module, in accordance with embodiments of the present invention. In this particular example, the voltage processing module can include voltage processing modules 1 and 2. Voltage processing module 1 can receive the signals output from the first voltage sampling ports (e.g., C0-C4) and from the temperature sampling ports (e.g., GPIO0-GPIO3), select one of the signals as the first signal, and perform analog-to-digital conversion on the first signal, in order to obtain the main measurement result. It should be understood that voltage processing module 1 can also receive other signals. Voltage processing module 2 may receive the signals output by the second voltage sampling ports (e.g., B0-B4) and by the temperature sampling ports (e.g., GPIO0-GPIO3), select one of the signals corresponding to the first signal as the second signal, and perform analog-to-digital conversion on the second signal to obtain the auxiliary measurement result. For example, performing analog-to-digital conversion on the second signal and the first signal can occur at the same time. It should be understood that voltage processing module 2 can also receive other signals, such as reference temperature at port TREF.

For example, voltage processing module 1 can include gating circuit 11, differential amplifying circuit A1, multiplexing circuit 12, and analog-to-digital converting circuit ADC1. Gating circuit 11 can select two sampling signals output by two adjacent first voltage sampling ports in the first voltage sampling port group. Two input terminals of differential amplifying circuit A1 may respectively be connected with two output terminals of gating circuit 11 to obtain signal V1$i$ (e.g., i=1, 2, 3, 4) representing the difference between the selected two sampling signals, that is, representing the voltage of the corresponding battery. For example, if gating circuit 11 selects ports C4 and C3, the two input terminals of differential amplifying circuit A1 may respectively receive signal Vc4 output from port C4 and signal Vc3 output from port C3, and the output terminal of differential amplifying circuit A1 can output signal V14 representing the voltage of battery 4, where V14=k*(Vc4−Vc3), and k is the proportional coefficient. It should be understood that if ports C3 and C2 are selected, signal V13 representing the voltage of battery 3 can be obtained, if ports C2 and C1 are selected, signal V12 representing the voltage of battery 2 can be obtained, and if ports C1 and C0 are selected, signal V11 representing the voltage of battery 1 can be obtained. In this example, signal V1$i$ output by differential amplifying circuit A1 may be a differential signal. Multiplexing circuit 12 may receive signal V1$i$ output by differential amplifying circuit A1 and the signals from the temperature sampling ports, in order to select one signal as the first signal and send it to analog-to-digital converting circuit ADC1 for analog-to-digital conversion. In this example, a buffer can connect between analog-to-digital converting circuit ADC1 and multiplexing circuit 12 to avoid interference between signals.

Similarly, voltage processing module 2 can include gating circuit 21, differential amplifying circuit A2, multiplexing circuit 22, and analog-to-digital converting circuit ADC2. Gating circuit 21 can select two sampling signals output by two adjacent second voltage sampling ports in the second voltage sampling port group. For example, the serial numbers of the two selected second voltage sampling ports can be consistent with those of the two selected first voltage sampling ports, and gating circuit 21 may operate simultaneously with gating circuit 11, thereby acquiring the voltage of one battery at substantially the same time. In this example, signal V2$i$ output by differential amplifying circuit A2 may be a differential signal. Multiplexing circuit 22 may receive signal V2$i$ output by differential amplifying circuit A2 and the signals from the temperature sampling ports, in order to select one signal corresponding to the first signal as the second signal and send it to analog-to-digital converting circuit ADC2 for analog-to-digital conversion. For example, first and second analog-to-digital converting circuit ADC1 and ADC2 may operate synchronously, analog-to-digital converting circuit ADC1 may be the main analog-to-digital converting circuit, and analog-to-digital converting circuit ADC2 may be the auxiliary analog-to-digital converting circuit, such that the output signal of analog-to-digital converting circuit ADC1 is the feedback signal. When the first signal is signal V1$i$, the second signal is signal V2$i$, and when the first signal is a signal output from the port GPIOi, the second signal is also a signal output from the port GPIOi. In this example, a buffer can connect between analog-to-digital converting circuit ADC2 and multiplexing circuit 22 to avoid interference between signals.

In particular embodiments, two voltage processing modules may be utilized, each of voltage processing modules can obtain the voltage of each battery respectively, and the two voltage processing modules may operate synchronously. That is, the gating circuits in the two voltage processing modules may select the corresponding ports at the same time to obtain the voltage of the same battery, or receive the voltage of the same temperature sampling port at the same time, and the analog-to-digital converting circuits in the two voltage processing modules may be started simultaneously. For example, when the system intends to obtain the voltage of battery 4, gating circuit 11 can select ports C4 and C3 at the first time, and at the same time, gating circuit 21 may select ports B4 and B3 at the first time, in order to ensure that first and second differential amplifying circuits A1 and A2 finally output signals V14 and V24 representing the voltage of battery 4 at the same time. Thereafter, analog-to-digital converting circuit ADC1 and analog-to-digital converting circuit ADC2 may operate synchronously, and respectively may perform analog-to-digital conversion on signal V14 and signal V24 to obtain two measurement results. For example, an enable signal can be introduced, and when the enable signal is active, first and second analog-to-digital converting circuit ADC1 and ADC2 may start operating at the same time. It should be understood that the voltage processing module can also include a comparison circuit for comparing the difference between the two measurement results with a first predetermined value to judge whether a fault occurs in the measurement process. When the difference between the two measurement results is greater than the first predetermined value, this can indicate that the sampling path may have a fault and the main measurement result may not be adopted. Because the two measurement results are sampled at substantially the same time, sampling noise can be eliminated due to differential comparison, thus avoiding a fault false alarm caused by zero noise interference when one path is sampled and great noise interference when the other path is sampled. If the difference between the two measurement results is not greater than the first predetermined value, the digital signal output by analog-to-digital converting circuit ADC1 can be selected as the feedback signal for other modules to use.

It should be understood that the temperature measurement is different from the battery voltage measurement because the temperature sampling signal is basically not disturbed by noise interference, so this particular example may only sample the temperature through one sampling path, and not sample the temperature at the same place through two independent sampling paths. Of course, when more higher temperature accuracy is required in some applications, two sampling paths can also be used.

Figure 4:
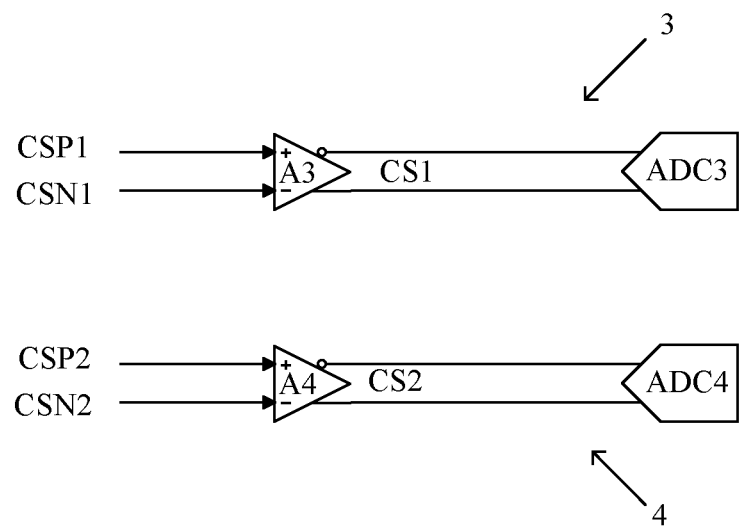
FIG. 4 is a schematic circuit diagram of an example current processing module, in accordance with embodiments of the present invention.

Referring now to FIG. 4, shown is a schematic circuit diagram of an example current processing module, in accordance with embodiments of the present invention. Particular example, the current processing module can include current processing modules 3 and 4. Current processing module 3 may receive the signals output from ports CSP1 and CSN1, obtain the difference between ports CSP1 and CSN1 to obtain current sampling signal CS1, and perform analog-todigital conversion on current sampling signal CS1 to obtain the main measurement result. Current processing module 4 may receive the signals output from ports CSP2 and CSN2, obtain the difference between ports CSP2 and CSN2 to obtain current sampling signal CS2, and perform analog-to-digital conversion on current sampling signal CS2 to obtain the auxiliary measurement result. For example, current processing module 3 can include differential amplifying circuit A3 and analog-to-digital converting circuit ADC3, the noninverting input terminal of differential amplifying circuit A3 can connect to port CSP1, the inverting input terminal of differential amplifying circuit A3 can connect to port CSN1, and the output terminal of differential amplifying circuit A3 can output current sampling signal CS1. Also, analog-to-digital converting circuit ADC3 may receive current sampling signal CS1 for conversion into a digital signal. Similarly, current processing module 4 can include differential amplifying circuit A4 and analog-to-digital converting circuit ADC4, the noninverting input terminal of differential amplifying circuit A4 can connect to port CSP2, the inverting input terminal of differential amplifying circuit A4 can connect to port CSN2, and the output terminal of differential amplifying circuit A4 the output current sampling signal CS2. Also, analog-to-digital converting circuit ADC4 may receive current sampling signal CS2 for conversion into a digital signal, where analog-to-digital converting circuits ADC4 and ADC3 may operate synchronously.

In particular embodiments, the current processing module can operate synchronously with the voltage processing module, such that the battery current is sampled while the battery voltage is sampled. That is, when analog-to-digital converting circuits ADC1 and ADC2 operate simultaneously to perform analog-to-digital conversion on the voltage sampling signal of the battery, analog-to-digital converting circuits ADC3 and ADC4 may also operate simultaneously to perform analog-to-digital conversion on the current sampling signal of the battery at this time.

It should be understood that the current processing module can also include a current comparison circuit for comparing the difference between current sampling signals CS1 and CS2 sampled from different current sampling paths with a second predetermined value to judge whether a fault occurs in the measurement process. When the difference is greater than the second predetermined value, this may indicate that the sampling path—the signal processing path may have a fault and the main measurement result should not be used. Also, when the difference is not greater than the second predetermined value, the digital signal output by the main analog-to-digital converting circuit can be used as a feedback signal for other modules, where analog-to-digital converting circuit ADC3 is the main analog-to-digital converting circuit and analog-to-digital converting circuit ADC4 is the auxiliary analog-to-digital converting circuit. Similarly, because the two measurement results are sampled at the same time, the sampling noise can be eliminated due to differential comparison, thus avoiding a fault false alarm caused by zero noise interference when one path is sampled and great noise interference when the other path is sampled.

In addition, the first and second current processing modules may respectively include an overcurrent protection circuit, which may respectively receive current sampling signals CS1 and CS2, and compare them against a current threshold. When the current sampling signal is greater than the current threshold, this may indicate that the system is overcurrent. In particular embodiments, the current signals sampled by two different paths may be utilized to determine whether to perform overcurrent protection, which can avoid a misjudgment of overcurrent when one of the sampling paths has potential problems.

In this way, the synchronous monitoring circuit of particular embodiments may adopt two channels of ADC to synchronously perform analog-to-digital conversion on the sampling signals, where one ADC is the main ADC and the other ADC is the auxiliary ADC, in order to obtain two measurement results representing the state parameter of a battery at the same time, and determine whether a fault occurs in the measurement process according to the difference between the two measurement results. Because the two ADC channels are carried out at substantially the same time, the sampling noise can be eliminated due to differential comparison, which can avoid a fault false alarm caused by zero noise interference when one path is sampled and great noise interference when the other path is sampled, thus meeting requirements of ASIL D accuracy in any operating environment.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of synchronous monitoring for a battery management system, wherein the battery management system comprises a battery pack having a plurality of batteries coupled in series, the method comprising:
   a) obtaining first and second measurement results representing a state parameter of a battery at a same time, wherein the obtaining the first and second measurement results comprises simultaneously obtaining a first sampling signal representing the first measurement result, and a second sampling signal representing the second measurement results, and simultaneously performing analog-to-digital conversion on the first and second sampling signals; and
   b) determining a final result, wherein the first measurement result is a main measurement result and the second measurement result is an auxiliary measurement result, and the main measurement result is configured as the final result.

2. The method of claim 1, further comprising determining whether a fault occurs in a measurement process according to a difference between the first and second measurement results.

3. The method of claim 2, wherein:
   a) indicating a fault occurs in the measurement process when the difference is greater than a predetermined value; and
   b) selecting the main measurement result as a feedback signal when the difference is not greater than the predetermined value.

4. The method of claim 1, wherein when the state parameter is a voltage of the battery or a current flowing through the battery, the first and second measurement results are respectively obtained through two different sampling paths.

5. The method of claim 4, wherein obtaining a voltage of each battery at the same time comprises:
   a) sampling a voltage of each electrode of each battery through a first sampling path, and outputting each sampling signal through a first voltage sampling port group;

b) sampling a voltage of each electrode of each battery through a second sampling path, and outputting each sampling signal through a second voltage sampling port group; and c) wherein the first sampling path and the second sampling path are independent of each other.

6. The method of claim 5, further comprising:

a) obtaining a first difference that is the first sampling signal between two sampling signals output by two adjacent first voltage sampling ports selected in the first voltage sampling port group;

b) obtaining a second difference that is the second sampling signal between two sampling signals output by two adjacent second voltage sampling ports selected in the second voltage sampling port group;

c) transmitting the first difference to a first analog-to-digital converting circuit and the second difference to a second analog-to-digital converting circuit;

d) simultaneously performing analog-to-digital conversion on the first difference and the second difference to obtain the first and second measurement results; and e) wherein serial numbers of the selected two second voltage sampling ports are consistent with those of the selected two first voltage sampling ports, and the two second voltage sampling ports are selected simultaneously with the two first voltage sampling ports, in order to obtain voltages of a same battery at the same time.

7. The method of claim 4, wherein obtaining a current flowing through the battery at the same time comprises:

a) obtaining a first current sampling signal that is the first sampling signal flowing through the battery through a first current sampling unit;

b) obtaining a second current sampling signal that is the second sampling signal flowing through the battery through a second current sampling unit; and c) wherein the first current sampling unit is coupled between a cathode of a battery with a lowest potential and a second terminal, and the second current sampling unit is coupled between an anode of a battery with a highest potential and a first terminal.

8. The method of claim 7, further comprising:

a) transmitting the first current sampling signal to a third analog-to-digital converting circuit and the second current sampling signal to a fourth analog-to-digital converting circuit; and b) simultaneously performing analog-to-digital conversion on the first current sampling signal and the second current sampling signal to obtain the first and second measurement results.

9. The method of claim 1, wherein when the state parameter is a temperature value where the battery is located, the first and second measurement results are obtained through a same sampling path.

10. The method of claim 9, further comprising:

a) obtaining the temperature values where corresponding batteries are located through a plurality of temperature sampling ports;

b) selecting a first temperature sampling signal that is the first sampling signal output by a temperature sampling port, and a second temperature sampling signal that is the second sampling signal output by the temperature sampling port, and respectively transmitting the first and second temperature sampling signals to a first analog-to-digital converting circuit and a second analog-to-digital converting circuit; and c) simultaneously performing analog-to-digital conversion on the first and second temperature sampling signals to obtain the first and second measurement results.

11. A synchronous monitoring circuit for a battery management system, wherein the battery management system comprises a battery pack comprising N batteries coupled in series, wherein N is a positive integer, the synchronous monitoring circuit comprising:

a) a data processing module configured to obtain first and second measurement results representing a state parameter of a battery at a same time, and to determine whether a fault occurs in a measurement process according to a difference between the first and second measurement results, wherein the first and second measurement results are obtained by simultaneously performing analog-to-digital conversion; and b) wherein the first measurement result is a main measurement result and the second measurement result is an auxiliary measurement result, and the main measurement result is configured as a final result.

12. The synchronous monitoring circuit of claim 11, wherein the data processing module is configured to:

a) indicate a fault occurs in the measurement process when the difference is greater than a predetermined value; and b) select the main measurement result as a feedback signal when the difference is not greater than the predetermined value.

13. The synchronous monitoring circuit of claim 11, further comprising:

a) a first voltage sampling port group configured to acquire sampling signals representing voltages of N batteries via a first voltage sampling path; and b) a second voltage sampling port group configured to acquire sampling signals representing voltages of N batteries via a second voltage sampling path.

14. The synchronous monitoring circuit of claim 13, wherein:

a) the first voltage sampling port group comprises N+1 first voltage sampling ports respectively coupled to N+1 electrodes of N batteries; and b) the second voltage sampling port group comprises N+1 second voltage sampling ports respectively coupled to N+1 electrodes of N batteries.

15. The synchronous monitoring circuit of claim 14, wherein the data processing module further comprises:

a) first voltage processing module configured to receive signals output by the first voltage sampling ports and output by temperature sampling ports, to select one of the signals as a first signal, and to perform analog-to-digital conversion on the first signal to obtain the main measurement result;

b) a second voltage processing module configured to receive signals outputs by the second voltage sampling ports and output by the temperature sampling ports, to select a signal corresponding to the first signal as a second signal, and to perform analog-to-digital conversion on the second signal to obtain the auxiliary measurement result; and c) wherein analog-to-digital conversion is simultaneously performed on the first signal and the second signal.

16. The synchronous monitoring circuit of claim 15, wherein the first voltage processing module comprises:

a) a first gating circuit configured to select two adjacent first voltage sampling ports in the first voltage sampling port group to output two sampling signals;

b) a first differential amplifying circuit configured to obtain a difference between the two sampling signals;
c) a first multiplexing circuit configured to receive the difference and signals output by the temperature sampling ports, and to select one of the difference and the signals as the first signal; and
d) a first analog-to-digital converting circuit configured to perform analog-to-digital conversion on the first signal.

17. The synchronous monitoring circuit of claim 16, wherein the second voltage processing module comprises:
   a) a second gating circuit configured to select two adjacent second voltage sampling ports in the second voltage sampling port group to output two sampling signals, wherein serial numbers of the selected two second voltage sampling ports are consistent with those of the selected two first voltage sampling ports, and the second gating circuit operates simultaneously with the first gating circuit;
   b) a second differential amplifying circuit configured to obtain a difference between the two sampling signals;
   c) a second multiplexing circuit configured to receive the difference and signals output by the temperature sampling ports, and to select a signal corresponding to the first signal as a second signal; and
   d) a second analog-to-digital converting circuit configured to perform analog-to-digital conversion on the second signal.

18. The synchronous monitoring circuit of claim 11, further comprising:
   a) a first current sampling port group configured to acquire a first current sampling signal representing a current flowing through each battery via a first current sampling path; and
   b) a second current sampling port group configured to acquire a second current sampling signal representing the current flowing through each battery via a second current sampling path.

19. The synchronous monitoring circuit of claim 18, wherein:
   a) the first current sampling port group comprises two first current sampling ports coupled with a first current sampling unit, wherein the first current sampling unit is coupled between a second terminal and a cathode of a battery with a lowest potential; and
   b) the second current sampling port group comprises two second current sampling ports coupled with a second current sampling unit, wherein the second current sampling unit is coupled between an anode of a battery with a highest potential and a first terminal.

20. The synchronous monitoring circuit of claim 19, wherein the data processing module further comprises:
   a) a first current processing module configured to receive signals output by the two first current sampling ports, to obtain the first current sampling signal according to the difference between the signals output by the two first current sampling ports, and to perform analog-to-digital conversion on the first current sampling signal to obtain the main measurement result;
   b) a second current processing module configured to receive signals output by the two second current sampling ports, to obtain the second current sampling signal according to the difference between the signals output by the two second current sampling ports, and to perform analog-to-digital conversion on the second current sampling signal to obtain the auxiliary measurement result; and
   c) wherein the first current processing module and the second current processing module operate synchronously.

* * * * *